(12) United States Patent
Lin

(10) Patent No.: US 10,879,149 B2
(45) Date of Patent: Dec. 29, 2020

(54) LOCATING UNIT WITH BASE SEAT LOCATING STRUCTURE

(71) Applicant: ASIA VITAL COMPONENTS CO., LTD., New Taipei (TW)

(72) Inventor: Sheng-Huang Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 0 days.

(21) Appl. No.: 16/384,951

(22) Filed: Apr. 16, 2019

(65) Prior Publication Data

US 2020/0235035 A1 Jul. 23, 2020

(51) Int. Cl.
*H01L 23/40* (2006.01)

(52) U.S. Cl.
CPC ...... *H01L 23/4006* (2013.01); *H01L 23/4093* (2013.01); *H01L 2023/4081* (2013.01)

(58) Field of Classification Search
CPC . H01L 23/4006; H01L 23/34; H01L 23/4093; H01L 2023/4081; H01L 23/427
See application file for complete search history.

(56) References Cited

U.S. PATENT DOCUMENTS

| | | | |
|---|---|---|---|
| 7,110,261 B2 * | 9/2006 | Lee | H01L 23/4093 165/185 |
| 7,554,810 B1 * | 6/2009 | Sun | H01L 23/4006 165/185 |
| 2002/0181206 A1 * | 12/2002 | Isenburg | H01L 23/4093 361/720 |
| 2004/0057212 A1 * | 3/2004 | Russell | H01L 23/4006 361/704 |
| 2005/0078455 A1 * | 4/2005 | MacGregor | H01L 23/4006 361/719 |
| 2008/0156458 A1 * | 2/2008 | Li | H01L 23/4006 165/80.3 |
| 2009/0103270 A1 * | 4/2009 | Desrosiers | G01R 1/0458 361/719 |
| 2009/0237888 A1 * | 9/2009 | Chen | H01L 23/4093 361/709 |
| 2011/0057080 A1 * | 3/2011 | Lu | H01L 23/4006 248/217.4 |
| 2017/0105279 A1 * | 4/2017 | Lin | H05K 1/0201 |

\* cited by examiner

*Primary Examiner* — Roshn K Varghese

(74) *Attorney, Agent, or Firm* — Thomas J. Nikolai; DeWitt LLP

(57) ABSTRACT

A locating unit with a base seat locating structure. The base seat locating structure includes a base seat and a locating unit. The base seat has a pair of locating holes each having a first locating hole section and a second locating hole section and a connection section connected therebetween. The second locating hole section has a locating recess. The locating unit has a main body having a first side and a second side and a through hole passing through the main body between the first and second sides. A first protruding key and a second protruding key protrude from the second side beside the through hole. The first and second protruding keys are displaceably assembled and connected with the locating holes. Free ends of the first and second protruding keys respectively have a first end section and a second end section connected and assembled with the locating recesses.

4 Claims, 9 Drawing Sheets

LOCATING UNIT WITH BASE SEAT LOCATING STRUCTURE

This application claims the priority benefit of Taiwan patent application number 108102353 filed on Jan. 22, 2019.

BACKGROUND OF THE INVENTION

1. Field of the Invention

The present invention relates generally to a locating unit with a base seat locating structure, and more particularly to a locating unit with a base seat locating structure, which serves as a medium for securing a threaded member or a locking member on the base seat.

2. Description of the Related Art

Various electronic components are mounted on an electronic apparatus for performing different works. In operation, these electronic components will generate high heat, especially the central processing unit or the other chips in charge of providing calculation function. Therefore, it is necessary to additionally apply heat dissipation component to the electronic component to dissipate the heat thereof so as to prevent the central processing unit or the other chips from burning out.

The often seen heat dissipation components include heat sink, vapor chamber, radiating fin assembly, etc. The heat dissipation component must be in tight contact with and attached to the heat source such as the central processing unit or the other chips without any gap therebetween so that no thermal resistance will hinder the heat from being conducted and dissipated. In general, the heat dissipation component is securely locked on the motherboard by means of threaded members. A nut member with inner thread is disposed on the heat dissipation component. A locking unit is passed through the motherboard from the other side thereof to screw into the nut member so as to secure the heat dissipation component on the motherboard. The nut member must be temporarily fixed on the heat dissipation component by means of a nut gasket so as to prevent the nut member from detaching from the heat dissipation component. The nut gasket is made of plastic material and has at least two extending posts. The extending posts are first passed through the perforations preformed on the heat dissipation component and then the free ends of the extending posts are fused at high temperature and flattened and deformed into stopper sections, whereby the extending posts are prevented from being extracted out so as to secure the nut gasket and the nut on the heat dissipation component.

However, in the above process, it is time-costing to fuse the extending posts at high temperature and wait for the cooling and shaping of the extending posts. Moreover, after fused at high temperature, the plastic material will floss to waste the working time and complicate the manufacturing process. In addition, it is impossible to rework the nut gasket.

It is therefore tried by the applicant to provide a locating unit and a base seat locating structure thereof to solve the problems existing in the conventional nut gasket.

SUMMARY OF THE INVENTION

It is therefore a primary object of the present invention to provide a locating unit with a base seat locating structure, which can quickly and securely connect the nut gasket with the heat dissipation component.

To achieve the above and other objects, the base seat locating structure of the present invention includes a base seat and a locating unit. The base seat has a pair of locating holes. Each locating hole has a first locating hole section and a second locating hole section and a connection section connected between the first and second locating hole sections. The second locating hole section has a locating recess. The locating unit has a main body. The main body has a first side and a second side and a through hole passing through the main body between the first and second sides. A first protruding key and a second protruding key protrude from the second side beside the through hole. The first and second protruding keys are relatively horizontally displaced to correspondingly assemble and connect with the locating holes. The free ends of the first and second protruding keys respectively have a first end section and a second end section. The first and second end sections are connected and assembled with the locating recesses so as to securely assemble the main body with the base seat.

By means of the structural design of the locating unit with the base seat locating structure of the present invention, the locating unit can be quickly and easily connected with the base seat or detached therefrom by means of horizontally displacing the locating unit. Therefore, the present invention solves the problems of the conventional nut gasket that it is impossible to rework the nut gasket and the working process is complicated.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
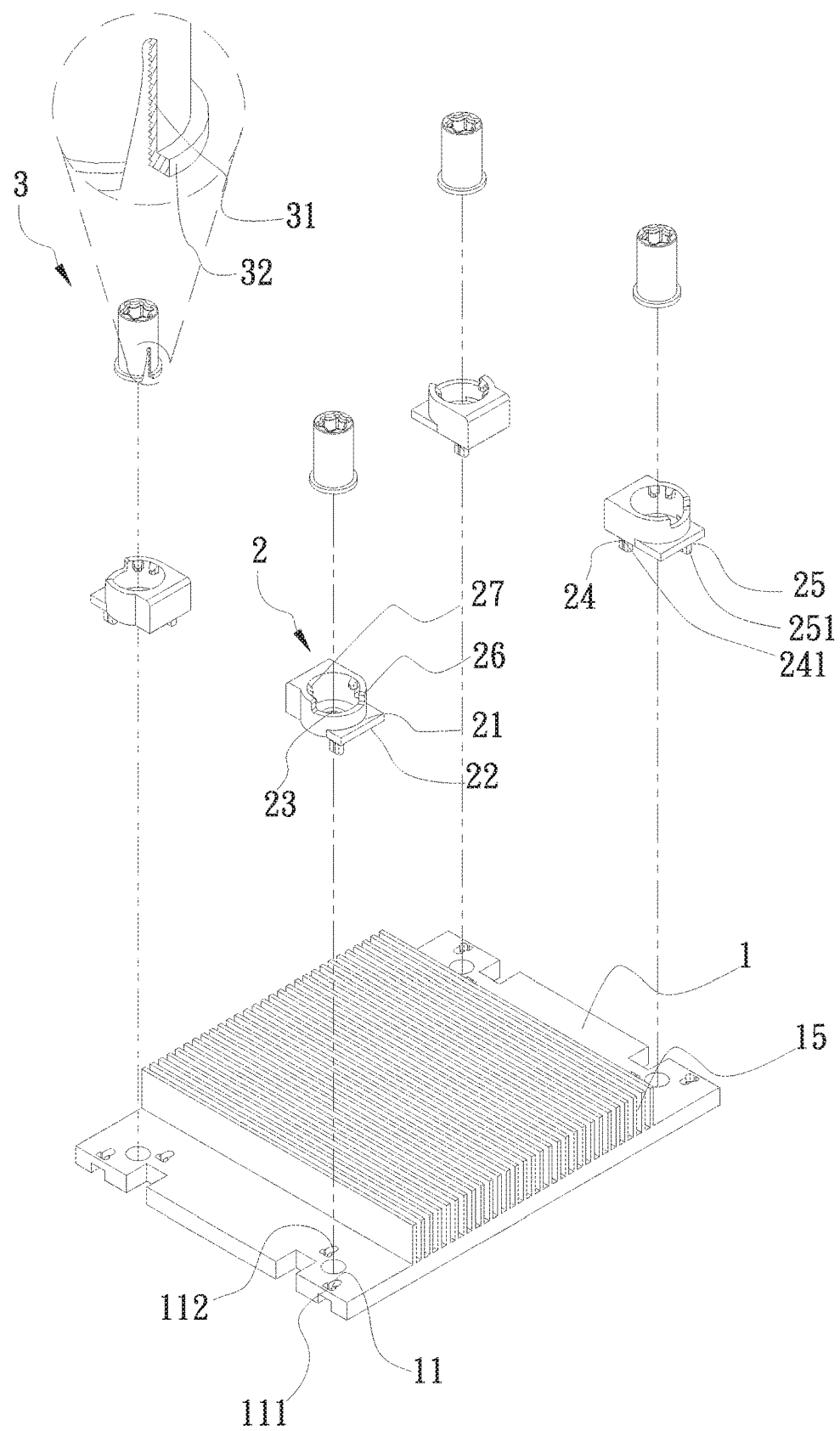
FIG. 1 is a perspective exploded view of a first embodiment of the locating unit and the base seat locating structure of the locating unit of the present invention.
Figure 2:
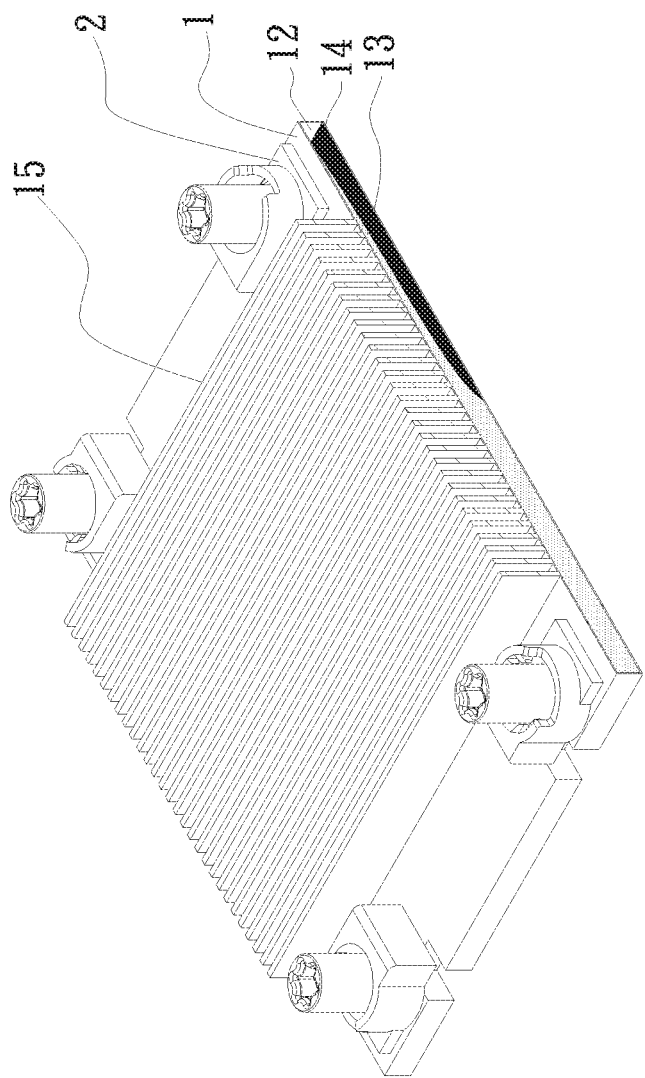
FIG. 2 is a perspective assembled view of the first embodiment of the locating unit and the base seat locating structure of the locating unit of the present invention.
Figure 3:
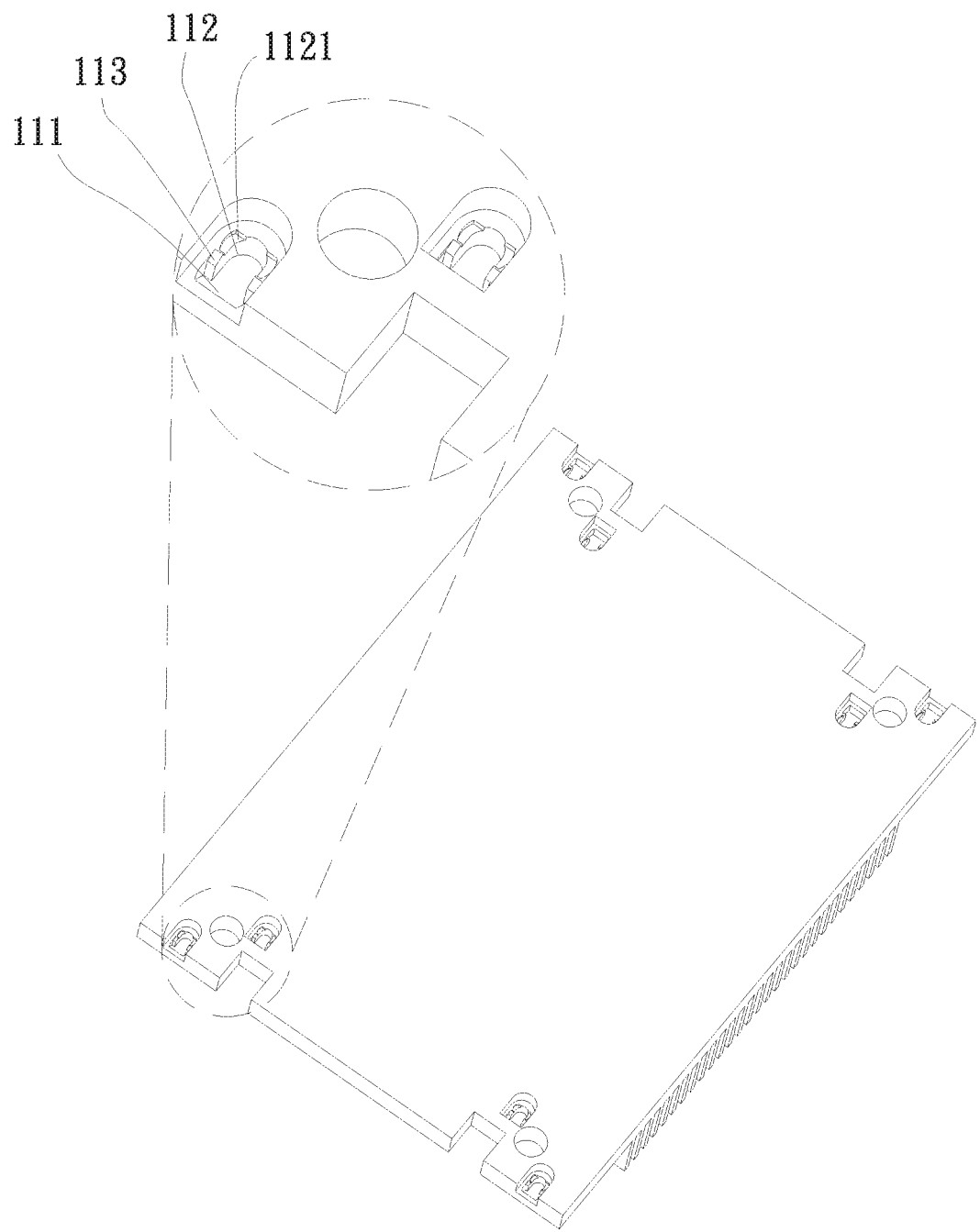
FIG. 3 is a perspective view of the first embodiment of the locating unit and the base seat locating structure of the locating unit of the present invention.

Please refer to FIGS. 1, 2 and 3. FIG. 1 is a perspective exploded view of a first embodiment of the locating unit and the base seat locating structure of the locating unit of the present invention. FIG. 2 is a perspective assembled view of the first embodiment of the locating unit and the base seat locating structure of the locating unit of the present invention. FIG. 3 is a perspective view of the first embodiment of the locating unit and the base seat locating structure of the locating unit of the present invention. The base seat locating structure of the present invention includes a base seat 1 and a main body 2 of a locating unit.

The base seat 1 has a pair of locating holes 11. Each locating hole 11 has a first locating hole section 111 and a second locating hole section 112 and a connection section 113 connected between the first and second locating hole sections 111, 112. The second locating hole section 112 has a locating recess 1121 formed on the second locating hole section 112.

The main body 2 has a first side 21 and a second side 22 and a through hole 23 passing through the main body 2 between the first and second sides 21, 22. A first protruding key 24 and a second protruding key 25 protrude from the second side 22 beside the through hole 23. The first and second protruding keys 24, 25 are relatively horizontally displaced to correspondingly assemble and connect with the locating holes 11. The free ends of the first and second protruding keys 24, 25 respectively have a first end section 241 and a second end section 251. The first and second end sections 241, 251 are connected and assembled with the locating recesses 1121.

A circumferential wall 26 protrudes from the circumference of the through hole 23 of the main body 2. A restriction section 27 is disposed on an inner circumference of the circumferential wall 26. The restriction section 27 is at least one protrusion body radially protruding from the inner circumference of the circumferential wall 26.

One end of a nut member 3 is inserted in the circumferential wall 26 around the through hole of the main body 2. The nut member 3 has an inner thread 31. The end of the nut member 3 inserted in the circumferential wall 26 has a flange 32. The restriction section 27 is engaged with the flange 32 to prevent the nut member 3 from detaching from the main body 2. The locating holes 11 are correspondingly disposed on the base seat 1.

The first end section 241 has a width larger than the diameter of the first protruding key 24. The second end section 251 has a width larger than the diameter of the second protruding key 25. The widths of the first and second end sections 241, 251 are larger than the width of the second locating hole section 112. The first and second end sections 241, 251 have a circular configuration, a square/rectangular configuration, a triangular configuration or any other geometrical configuration. The configuration of the first and second end sections 241, 251 corresponds to the configuration of the first and second locating hole sections 111, 112 of the locating holes 11. The connection section 113 is obliquely connected between the first and second locating hole sections 111, 112, whereby a height difference exists between the first and second locating hole sections 111, 112. In addition, the connection section 113 is connected with the locating recess 1121. The first and second end sections 241, 251 can be horizontally moved along the connection section 113 and then slightly moved in a vertical direction to fall into the locating recesses 1121 of the second locating hole sections 112 and securely engage therewith. Under such circumstance, the main body 2 is restricted in both the axial direction and the radial direction and securely connected with the base seat 1.

The base seat 1 is made of a material with good thermal conductivity. The base seat 1 can have an internal chamber 12. A capillary structure 13 and a working fluid 14 are disposed in the chamber 12. Multiple radiating fins 15 extend from one side of the base seat 1. The base seat 1 can be alternatively another heat conduction member (such as a vapor chamber, a heat plate or a two-phase fluid main body).

Figure 4:
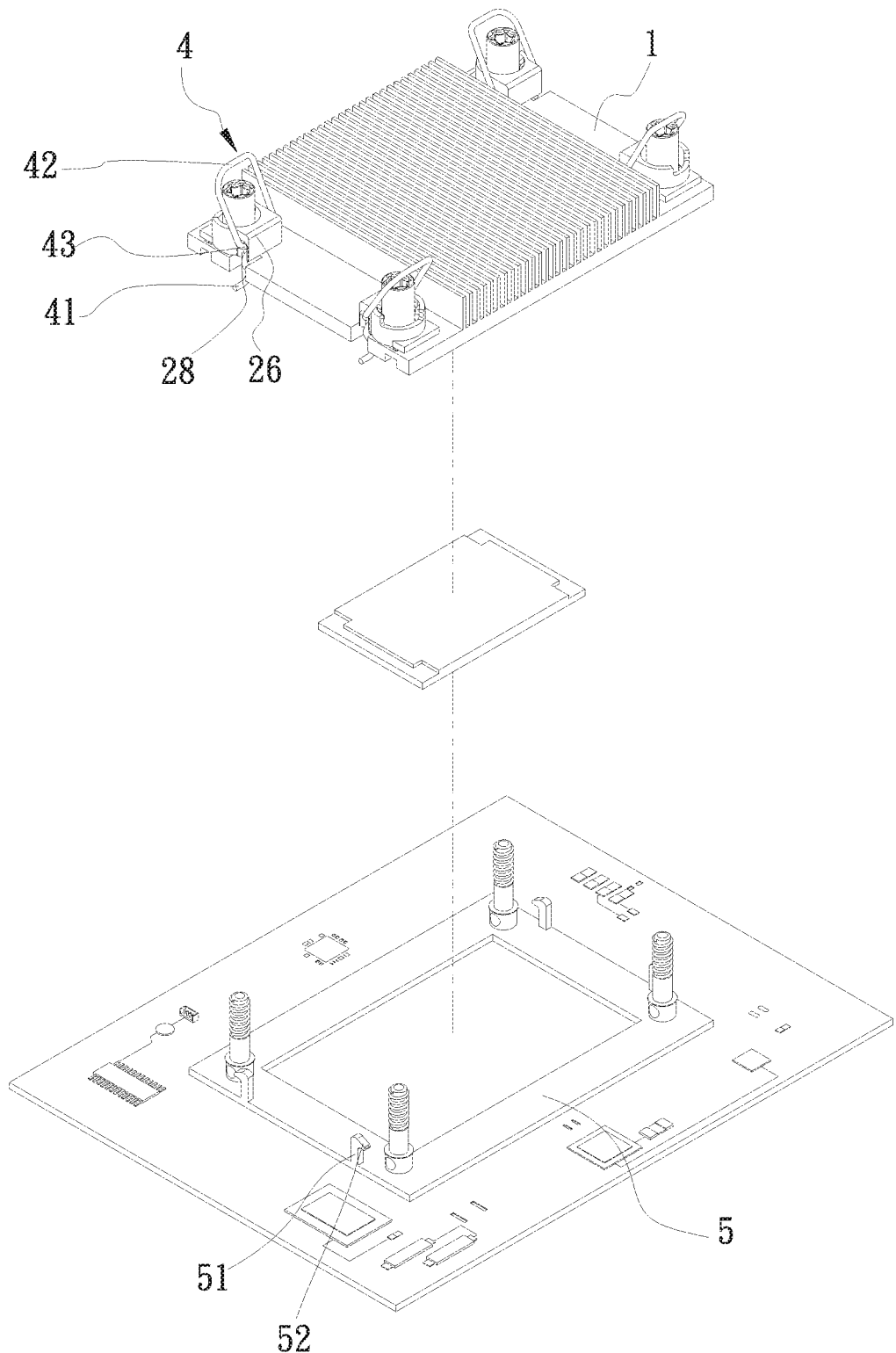
FIG. 4 is a perspective view of a second embodiment of the locating unit and the base seat locating structure of the locating unit of the present invention.
Figure 5A:
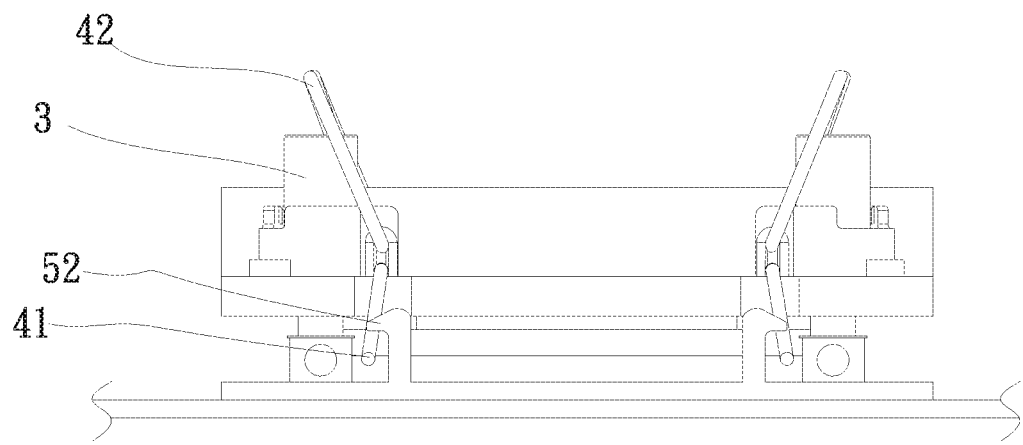
FIG. 5a is a side view of the second embodiment of the locating unit and the base seat locating structure of the locating unit of the present invention.
Figure 5B:
FIG. 5b is a side view of the second embodiment of the locating unit and the base seat locating structure of the locating unit of the present invention.
Figure 5B:
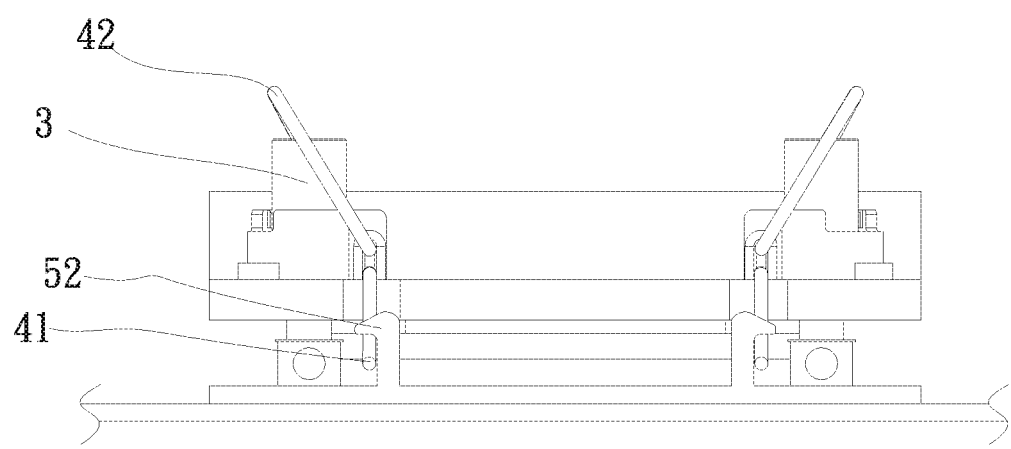

Please refer to FIGS. 4, 5a and 5b. FIG. 4 is a perspective view of a second embodiment of the locating unit and the base seat locating structure of the locating unit of the present invention. FIG. 5a is a side view of the second embodiment of the locating unit and the base seat locating structure of the locating unit of the present invention. FIG. 5b is a side view of the second embodiment of the locating unit and the base seat locating structure of the locating unit of the present invention. The second embodiment is partially identical to the first embodiment in structure and thus will not be redundantly described hereinafter. The second embodiment is different from the first embodiment in that an outer edge of the circumferential wall 26 is formed with a pivot slot 28.

A hook/latch rod member 4 has an extending hook end 41, an operation section 42 and a pivoted end 43. The operation section 42 is U-shaped. The pivoted end 43 and the extending hook end 41 respectively extend from two ends of the operation section 42. The pivoted end 43 and a part of the extending hook end 41 are received in the pivot slot 28.

A base seat frame body 5 is disposed on a circuit board. The base seat 1 is disposed on the base seat frame body 5. The base seat frame body 5 has multiple extending columns 51. Each extending column 51 has a free end formed with a hook section 52. By means of levering the operation section 42 of the hook/latch rod member 4, the extending hook end 41 can hook and latch with the hook section 52 of the extending column 51 or unlatch from the hook section 52.

Figure 6A:
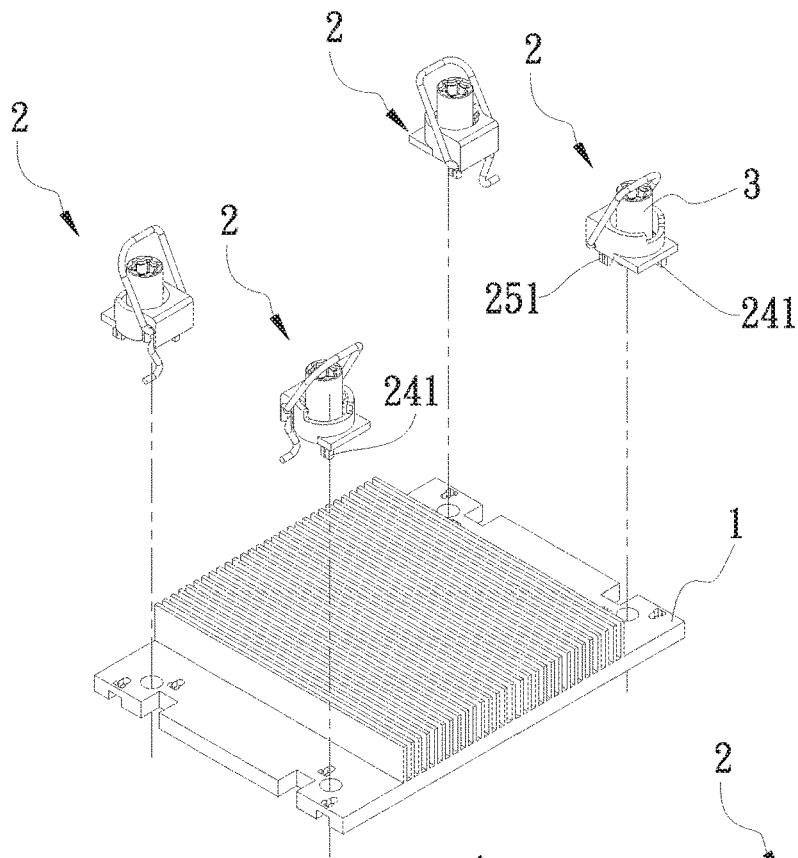
FIG. 6a is a perspective view showing the operation of the present invention.
Figure 6B:
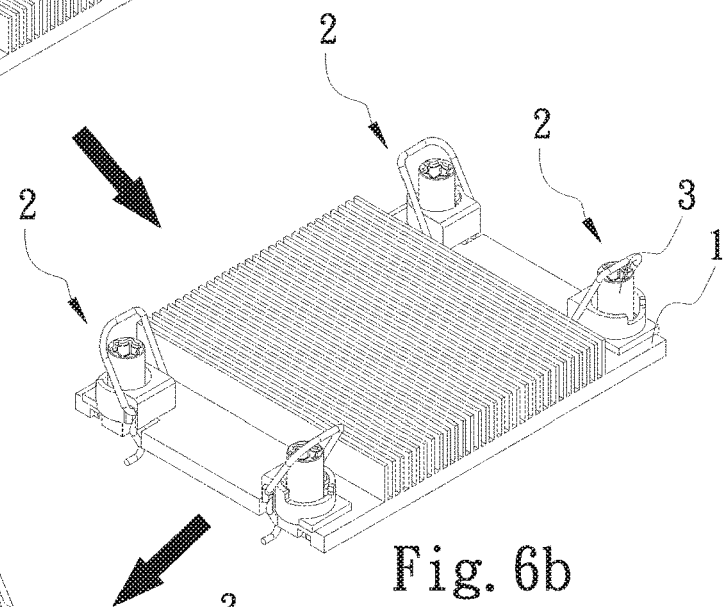
FIG. 6b is a perspective view showing the operation of the present invention.
Figure 6C:
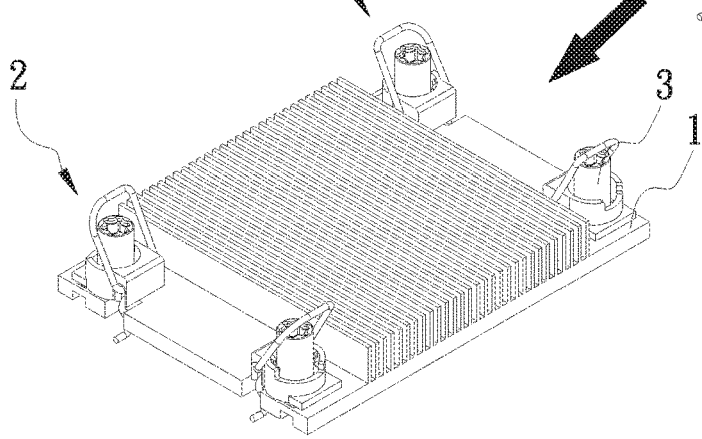
FIG. 6c is a perspective view showing the operation of the present invention.

Please refer to FIGS. 6a, 6b and 6c. FIG. 6a is a perspective view showing the operation of the present invention. FIG. 6b is a perspective view showing the operation of the present invention. FIG. 6c is a perspective view showing the operation of the present invention. Also referring to FIGS. 1~5a and 5b, the major object of the base seat locating member of the present invention is to secure the nut 3 on the base seat 1. As shown in FIG. 6a, the first and second end sections 241, 251 of the base seat locating member 2 are first inserted into the first locating hole sections 111 of the locating holes 11 (as shown in FIG. 6b). The base seat locating member 2 is then horizontally displaced to make the first and second protruding keys 24, 25 horizontally move from the first locating hole sections 111 of the locating holes 11 toward the second locating hole sections 112. After the first and second end sections 241, 251 of the first and second protruding keys 24, 25 pass through the connection sections 113, the first and second end sections 241, 251 fall into the locating recesses 1121 to be restricted therein. The width of the first and second end sections 241, 251 of the first and second protruding keys 24, 25 is larger than the width of the locating recesses 1121 of the second locating hole sections 112 and the first and second end sections 241, 251 are partially received in the locating recesses 1121. Therefore, the base seat locating member 2 is not only restricted in the vertical direction and prevented from being extracted out, but also restricted in the horizontal direction and prevented from being loosened/detached and slid/displaced. In this case, by means of the base seat locating member 2, the nut 3 is secured onto the base seat 1.

Figure 7:
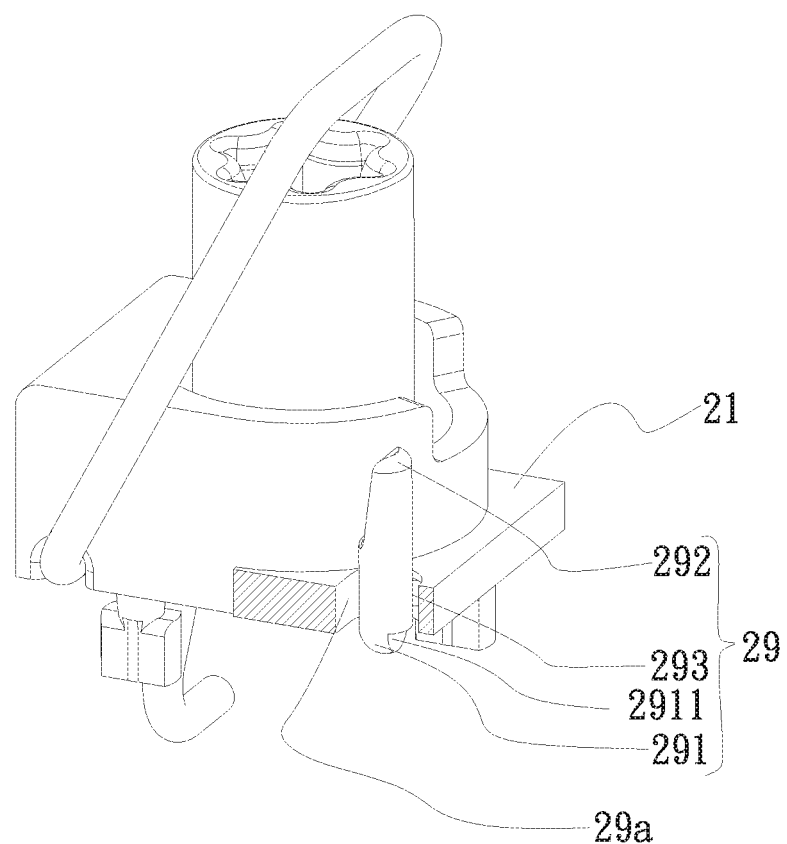
FIG. 7 is a perspective view of a third embodiment of the locating unit and the base seat locating structure of the locating unit of the present invention.
Figure 8A:
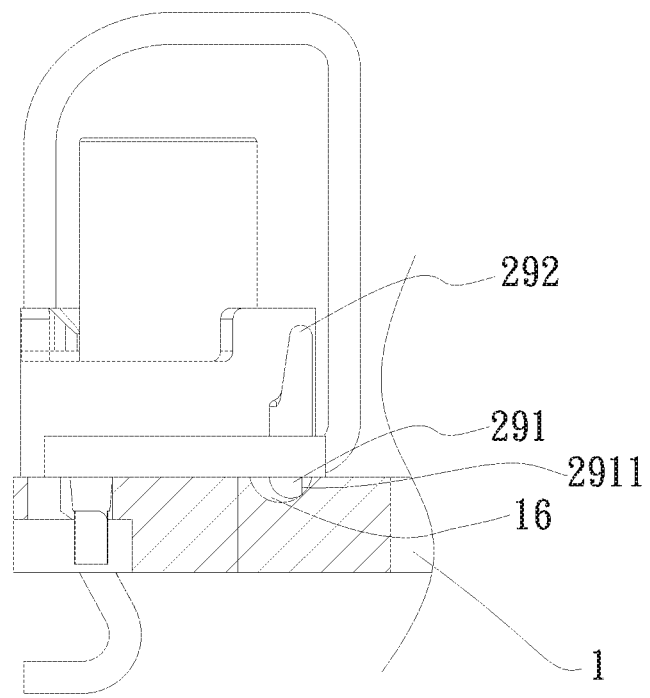
FIG. 8a is a sectional view of the third embodiment of the locating unit and the base seat locating structure of the locating unit of the present invention.
Figure 8B:
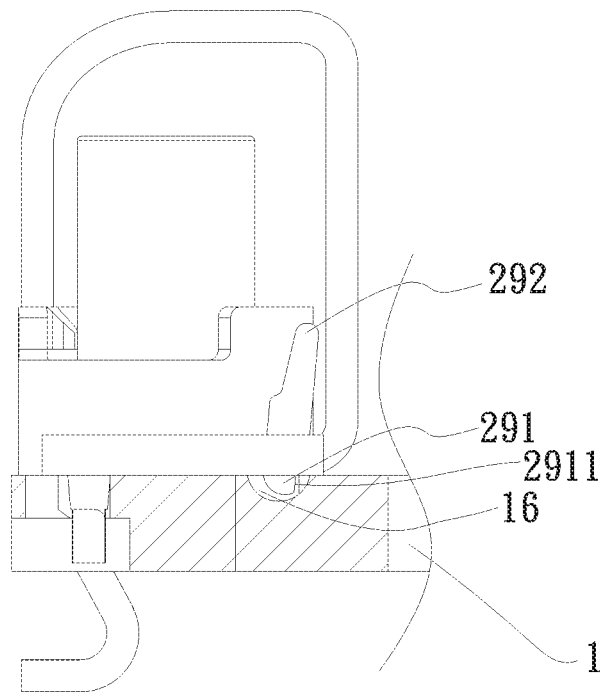
FIG. 8b is a sectional view of the third embodiment of the locating unit and the base seat locating structure of the locating unit of the present invention.
Figure 9A:
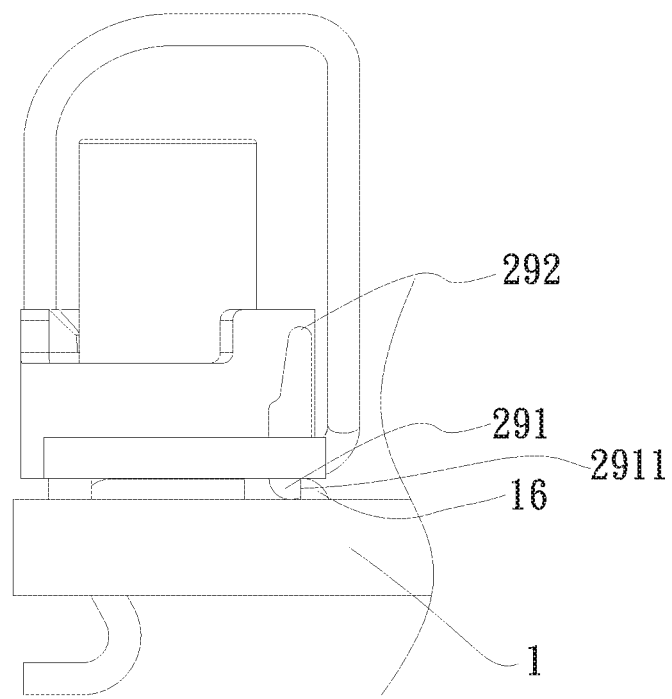
FIG. 9a is a side view of a fourth embodiment of the locating unit and the base seat locating structure of the locating unit of the present invention.
Figure 9B:
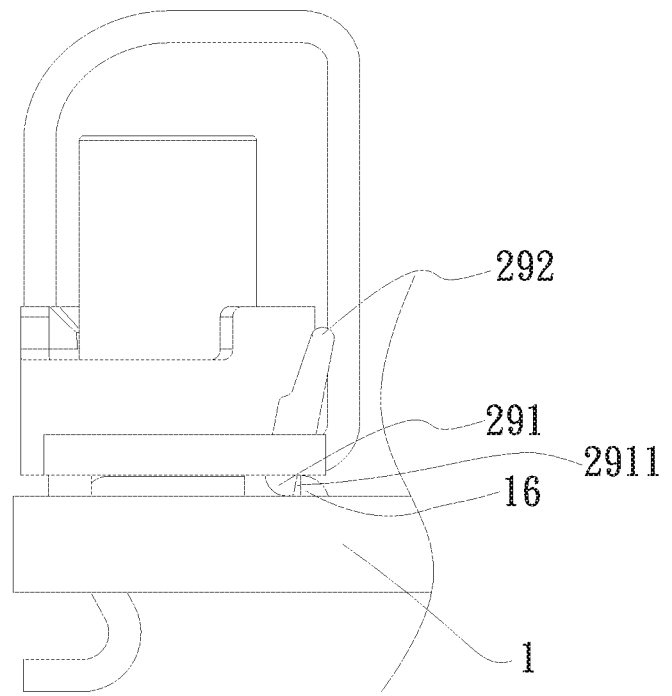
FIG. 9b is a side view of the fourth embodiment of the locating unit and the base seat locating structure of the locating unit of the present invention.

Please refer to FIGS. 7, 8a, 8b, 9a and 9b. FIG. 7 is a perspective view of a third embodiment of the locating unit and the base seat locating structure of the locating unit of the present invention. FIG. 8a is a sectional view of the third embodiment of the locating unit and the base seat locating structure of the locating unit of the present invention. FIG. 8b is a sectional view of the third embodiment of the locating unit and the base seat locating structure of the locating unit of the present invention. FIG. 9a is a side view of a fourth embodiment of the locating unit and the base seat locating structure of the locating unit of the present invention. FIG. 9b is a side view of the fourth embodiment of the locating unit and the base seat locating structure of the locating unit of the present invention. The third and fourth embodiments are partially identical to the first embodiment in structure and thus will not be redundantly described hereinafter. The third and fourth embodiments are different from the first embodiment in that the main body 2 further has a locating member 29 and a through hole 29a. The locating member 29 has a locating end 291 and an operation end 292. The locating end 291 of the locating member 29 has a semispherical configuration, an arched configuration or a slope configuration. In this embodiment, the locating end 291 of the locating member 29 has, but not limited to, a semispherical configuration for illustration purposes. In order to enhance the locating effect, the locating end 291 is additionally formed with an engagement face 2911. A connection rib 293 is connected between the locating end 291 and the operation end 292. The locating member 29 is passed through the through hole 29a and connected with the main body 2 via the connection rib 293. The locating end 291 and the operation end 292 protrude out of the through hole 29a. The base seat 1 is formed with a locating section 16 corresponding to the locating end 291.

Please further refer to FIGS. 8a and 8b. The locating section 16 is a dent. When the main body 2 is horizontally displaced to sink the locating end 291 of the locating member 29 of the main body 2 into the locating section 16 (the dent), the locating end 291 is engaged in the locating section 16 and restricted to prevent the main body 2 from moving in reverse direction and detaching from the base seat 1 (as shown in FIG. 8a). When detaching the main body 2, the operation end 292 of the locating member 29 is operated to disengage the engagement face of the locating end 291 of the locating member 29 out of the locating section 16 (as shown in FIG. 8b).

Further referring to FIGS. 9a and 9b, in this embodiment, the locating section is an outward protruding boss. When the main body 2 is horizontally displaced, the locating end 291 of the locating member 29 of the main body 2 is horizontally engaged with the locating section 16 (the outward protruding boss), whereby the main body 2 is restricted and prevented from moving in reverse direction and detaching from the base seat 1 (as shown in FIG. 9a). When detaching the main body 2, the operation end of the locating member 29 is operated to disengage the engagement face 2911 of the locating end 291 of the locating member 29 from the protruding section of the locating section 16 engaged therewith (as shown in FIG. 9b).

According to the above embodiments, the locating section 16 can be a dent (as shown in FIG. 8a) or an outward protruding boss (as shown in FIG. 9a). The locating section 16 and the locating end 291 have corresponding dented/protruding or protruding/protruding configurations, whereby the locating section 16 and the locating end 291 can be engaged with and restricted by each other. Under such circumstance, the main body 2 can be horizontally displaced to connect with the base seat 1 and prevented from detaching from the base seat 1 and truly located thereon.

The present invention mainly improves the shortcoming of the conventional nut gasket secured to the base seat. By means of rotational displacement, the base seat locating structure (the conventional nut gasket) can be quickly connected with the base seat or any other heat dissipation or heat conduction component or detached therefrom. Therefore, the assembling labor is saved and the assembling time is shortened and the reworking operation can be readily performed.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A locating unit with a base seat locating structure comprising:
   a base seat having a plurality of locating holes, each locating hole has a first locating hole section and a second locating hole section, a connection section being connected between the first locating hole section and the second locating hole section, the first locating hole section and the second locating hole section disposed at two ends of the locating hole, the second locating hole section has a locating recess formed on the second locating hole section, wherein the locating recess is located at the same position as the second locating hole section and vertically overlaps with the second locating hole section;
   a plurality of locating unit main bodies, each one associated with a locating hole in the base seat, each locating unit main body having a through hole, a pair of spaced protruding keys and a circumferential restricted section protruding from an internal circumference of the through hole of the locating unit main body, and
   further comprising a nut member having internal threads and an outer flange received in the through holes in each locating unit main body, wherein the internal threads are disposed at an inner side of a lower end of the nut member towards the base seat and the outer flange is disposed at an external outer side of the lower end of the nut member inserted in a circumferential wall protruded from the internal circumference of the through hole of the locating unit main body and retained by said circumferential restricted section, wherein the circumferential restriction section is disposed on an inner circumference of the circumferential wall.

2. A locating unit as in claim 1 wherein each of the protruding keys has an end section that connects and is assembled to a locating hole section recess thereby connecting the locating unit main body with the base seat.

3. A locating unit as in claim 2 wherein each locating hole section has a through hole and a locating recess and wherein the end sections of each protruding key has a width larger than the width of each through hole in the locating hole section but which can be caused to engage firmly with a corresponding locating hole section recess.

4. A locating unit as in claim 1 wherein the base seat is made of a material with good thermal conductivity selected from copper and aluminum.

\* \* \* \* \*